(12) United States Patent
Wedlake

(10) Patent No.: US 8,895,444 B2
(45) Date of Patent: Nov. 25, 2014

(54) HARD MASK REMOVAL DURING FINFET FORMATION

(71) Applicant: GLOBALFOUNDRIES Inc., Grand Cayman (KY)

(72) Inventor: Michael D. Wedlake, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 10 days.

(21) Appl. No.: 13/799,508

(22) Filed: Mar. 13, 2013

(65) Prior Publication Data

US 2014/0273455 A1 Sep. 18, 2014

(51) Int. Cl.
*H01L 21/302* (2006.01)
*H01L 21/3105* (2006.01)
*H01L 21/306* (2006.01)

(52) U.S. Cl.
CPC .... *H01L 21/30625* (2013.01); *H01L 21/31051* (2013.01)
USPC ............. 438/692; 438/689; 438/690; 216/37; 216/67

(58) Field of Classification Search
USPC ................................ 216/37, 67; 438/689–692
See application file for complete search history.

(56) References Cited

U.S. PATENT DOCUMENTS

| 6,764,884 B1 * | 7/2004 | Yu et al. .................. 438/157 |
| 7,588,985 B2 * | 9/2009 | Kim .......................... 438/270 |
| 8,513,127 B2 * | 8/2013 | Chang et al. .............. 438/693 |

* cited by examiner

*Primary Examiner* — Duy Deo
*Assistant Examiner* — Maki Angadi
(74) *Attorney, Agent, or Firm* — Darrell L. Pogue; Keohane & D'Alessandro, PLLC

(57) ABSTRACT

An approach for polishing-based hard mask removal during FinFET device formation is provided. In a typical embodiment, an initial device will be provided with a set of fins (e.g., silicon (Si)), a set of fin caps (e.g., silicon nitride (SiN)), and an oxide layer. A post-oxide planarizing and thinning polishing will first be performed (e.g., using a Silica-based slurry) to thin/reduce the oxide layer. A stop-on-nitride polishing will then be performed (e.g., using a Ceria-based slurry) to reduce the oxide layer to a top surface of the fin caps. Still yet, a stop-on-silicon polishing will be performed (e.g., using a Ceria-based slurry) to remove the set of fin caps and to reduce the oxide layer to a top surface to the set of fins.

18 Claims, 2 Drawing Sheets

HARD MASK REMOVAL DURING FINFET FORMATION

BACKGROUND OF THE INVENTION

1. Technical Field

In general, embodiments of the present invention relate to hard mask removal. Specifically, embodiments of the present invention relate to dielectric hard mask removal during the FinFET formation process.

2. Related Art

As semiconductor device scaling continues, the ability to control leakage currents and otherwise develop improved devices becomes more difficult. MOSFET technologies (e.g., FinFET devices), have been developed to overcome such limitations to transistor scaling. While thinner body FinFET devices can be used to obtain more aggressive gate length scaling to suppress short-channel effects, and to increase the effective channel width by combining multiple fins, the ability to fabricate fin structures with tight or narrow pitches was conventionally limited by capabilities of standard photolithography technologies. Along similar lines, FinFET devices may experience uniformity issues and/or damage caused by etching processes utilized to remove hard mask layers during device formation. Specifically, under existing approaches, wet/dry etching processes are performed so that hard mask layers may be removed. Unfortunately, such processes often cause damage to fin surfaces resulting in a lack of uniformity (e.g., an uneven fin profile).

SUMMARY OF THE INVENTION

In general, aspects of the present invention relate to an approach for polishing-based hard mask removal during FinFET device formation. In a typical embodiment, an initial device will be provided with a set of fins (e.g., silicon (Si)), a set of fin caps (e.g., silicon nitride (SiN)), and an oxide layer. A post-oxide planarizing and thinning polishing will first be performed (e.g., using a Silica-based slurry) to thin/reduce the oxide layer. A stop-on-nitride polishing will then be performed (e.g., using a Ceria-based slurry) to reduce the oxide layer to a top surface of the fin caps. Still yet, a stop-on-silicon polishing will be performed (e.g., using a Ceria-based slurry) to remove the set of fin caps and to reduce the oxide layer to a top surface to the set of fins.

A first aspect of the present invention provides a method for polishing a semiconductor device, comprising: performing a first polishing of a semiconductor device to thin an oxide layer over a set of fins of the semiconductor device, the set of fins having a set of caps; performing a second polishing of the semiconductor device to reduce the oxide layer to a top surface of the set of caps; and performing a third polishing of the semiconductor device to further reduce the oxide layer and to remove the set of caps from the set of fins.

A second aspect of the present invention provides a method for polishing a semiconductor device, comprising: forming a set of fins in a substrate, the set of fins having a set of caps; performing a first polishing of the semiconductor device to thin an oxide layer over the set of fins; performing a second polishing of the semiconductor device to reduce the oxide layer to a top surface of the set of caps on the set of fins; and performing a third polishing of the semiconductor device to further reduce the oxide layer and to remove the set of caps from the set of fins.

A third aspect of the present invention provides a method for polishing a FinFET device, comprising: performing a planarizing polishing of the FinFET device using at least one slurry to thin an oxide layer over a set of fins of the FinFET device, the set of fins having a set of silicon nitride (SiN) caps on a top surface thereof, and the at least one slurry having differing nitride, oxide, and silicon polishing rates; performing a post-selective stop-on-nitride polishing of the FinFET device using the at least one slurry to reduce the oxide layer to a top surface of the set of SiN caps on the set of fins; and performing a post-selective stop-on-silicon polishing of the FinFET device using the at least one slurry to further reduce the oxide layer and to remove the set of SiN caps from the set of fins.

BRIEF DESCRIPTION OF THE DRAWINGS

These and other features of this invention will be more readily understood from the following detailed description of the various aspects of the invention taken in conjunction with the accompanying drawings in which.

Figure 1:
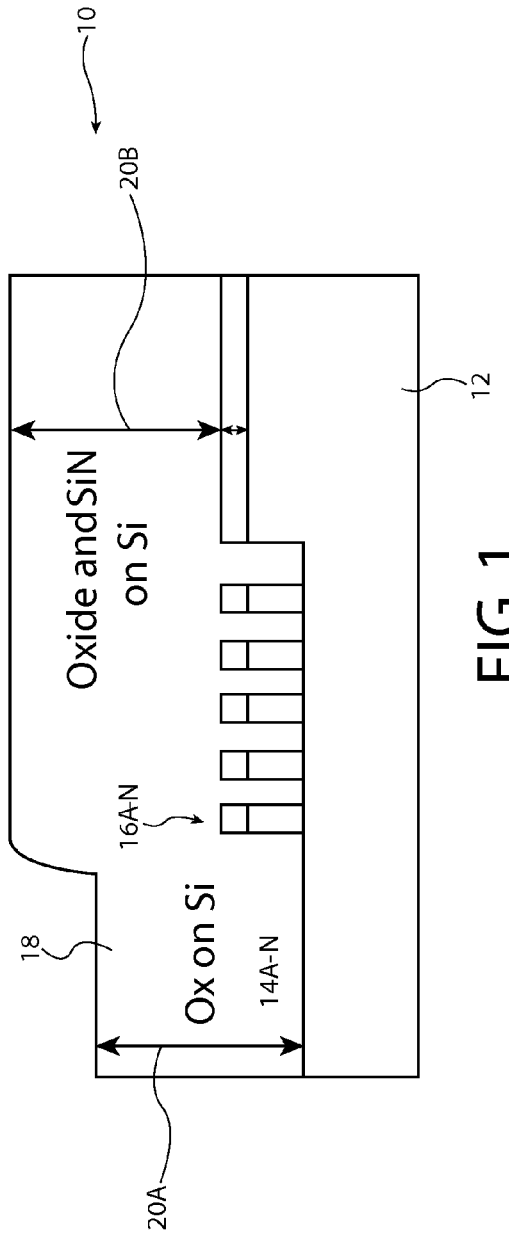
FIG. 1 shows an initial FinFET device formation according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

A fin-type field effect transistor (FinFET) is a type of metal-oxide semiconductor field effect transistor (MOSFET), which itself is a type of field-effect transistor (FET) that works by electronically varying the width of a channel along which charge carriers (electrons or holes) flow. In general, the wider the channel, the better the device conducts. The charge carriers enter the channel at the source and exit via the drain. The width of the channel is controlled by the voltage on an electrode called the gate, which is located physically between the source and the drain and is insulated from the channel by an extremely thin layer of metal oxide.

There are two ways in which a MOSFET typically functions. The first is known as depletion mode. When there is no voltage on the gate, the channel exhibits its maximum conductance. As the voltage on the gate increases (e.g., either positively or negatively, depending on whether the channel is made of P-type or N-type semiconductor material), the channel conductivity decreases. A second way in which a MOSFET can operate is called enhancement mode. When there is no voltage on the gate, there is in effect no channel, and the device does not conduct. A channel is produced by the application of a voltage to the gate. The greater the gate voltage, the better the device conducts.

The MOSFET has certain advantages over a conventional junction FET, or JFET. Specifically, because the gate is insulated electrically from the channel, no current flows between the gate and the channel no matter what the gate voltage (e.g., as long as it does not become so great that it causes physical breakdown of the metallic oxide layer). Thus, the MOSFET has practically infinite impedance. This makes MOSFETs useful for power amplifiers. The devices are also well suited to high-speed switching applications. Some integrated circuits (ICs) contain tiny MOSFETs and are used in computers. Because the oxide layer is so thin, a MOSFET is susceptible to permanent damage by electrostatic charges. Even a small electrostatic buildup can destroy a MOSFET permanently. In weak-signal radio-frequency (RF) work, MOSFET devices do not generally perform as well as other types of FET.

As indicated above, aspects of the present invention relate to an approach for polishing-based hard mask removal during FinFET device formation. In a typical embodiment, an initial device will be provided with a set of fins (e.g., silicon (Si)), a set of fin caps (e.g., silicon nitride (SiN)), and an oxide layer. A post-oxide planarizing and thinning polishing will first be performed (e.g., using a Silica-based slurry) to thin/reduce the oxide layer. A stop-on-nitride polishing will then be performed (e.g., using a Ceria-based slurry) to reduce the oxide layer to a top surface of the fin caps. Still yet, a stop-on-silicon polishing will be performed (e.g., using a Ceria-based slurry) to remove the set of fin caps and to reduce the oxide layer to a top surface to the set of fins.

Referring to FIG. 1, a semiconductor device 10 (e.g., a FinFET device) according to an embodiment of the present invention is shown. As depicted, device 10 includes substrate 12 (e.g., Si), set of fins 14A-N (e.g., Si), and set of fin caps 16A-N (e.g., SiN). As further shown, an oxide layer is present over substrate 12, fins 14A-N, and caps 16A-N. Moreover, oxide layer 18 may have varying layers of "thickness" shown by dimensions 20A and 20B. In accordance with teachings recited herein, oxide layer 18 will be reduced/thinned out and planarized. As will be described, the polishing will typically occur via CMP using at least one slurry that has different oxide, silicon, and nitride polishing rates.

Figure 2:
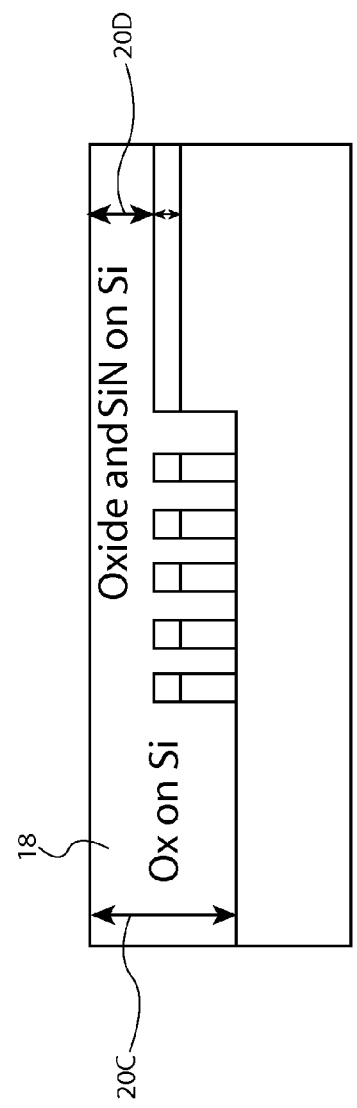
FIG. 2 shows a planarizing and oxide layer thinning polishing of a FinFET device according to an embodiment of the present invention.

As such, referring to FIG. 2, the device is shown after a first polishing (e.g., CMP) operation. Specifically, a Silica-based slurry is utilized to CMP oxide layer 18 so that it is planar and reduced in thickness as denoted by dimensions 20C and 20D.

Figure 3:
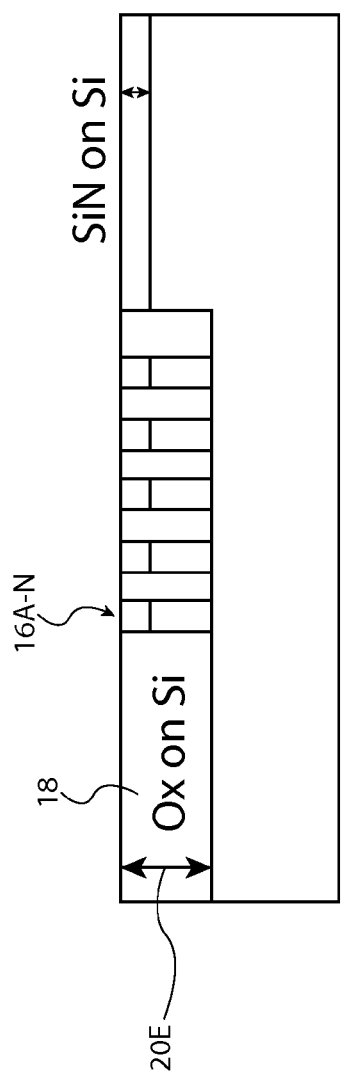
FIG. 3 shows a stop-on-nitride polishing of a FinFET device according to an embodiment of the present invention.

Referring to FIG. 3, the device is shown after a second polishing operation; namely, a stop-on-nitride polishing in which oxide layer 18 is further reduced in thickness to a top surface of caps 16A-N. This is so that the oxide layer 18 thickness can be marked by dimension 20E, notably thinner than its counterpart dimensions 20A and 20C in FIGS. 1 and 2, respectively. In general, this polishing operation is made via CMP using a Ceria-based slurry for selectively stopping on nitride (e.g., the top surfaces of SiN caps 16A-N)

Figure 4:
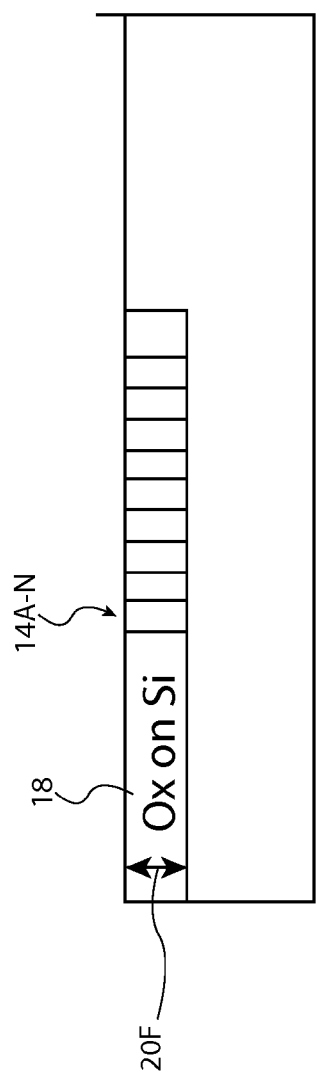
FIG. 4 shows a stop-on-silicon polishing of a FinFET device according to an embodiment of the present invention.

Referring to FIG. 4, the device is shown after a third polishing operation; namely, a stop-on-silicon polishing in which oxide layer 18 is further reduced in thickness to a top surface of fins 14A-N. This is so that oxide layer 18 thickness can be marked by dimension 20F, notably thinner than its counterpart dimension 20E in FIG. 3. In general, this polishing operation is made via CMP using a Ceria-based slurry for selectively stopping on silicon (e.g., the top surfaces of Si fins 14A-N).

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention.

Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for polishing a semiconductor device, comprising:
    performing a first polishing of a semiconductor device to thin an oxide layer over a set of fins of the semiconductor device, the set of fins having a set of silicon nitride (SiN) caps;
    performing a second polishing of the semiconductor device to reduce the oxide layer selective to a top surface of the set of SiN caps; and
    performing a third polishing of the semiconductor device to further reduce the oxide layer and to remove the set of SiN caps from the set of fins.

2. The method of claim 1, the first polishing, the second polishing, and the third polishing being performing using at least one slurry having differing nitride, oxide, and silicon polishing rates.

3. The method of claim 1, the first polishing, the second polishing, and the third polishing each comprising chemical mechanical polishing.

4. The method of claim 1, the first polishing comprising a planarizing and thinning polishing.

5. The method of claim 1, the second polishing comprising a post-selective stop-on-nitride (Ni) polishing.

6. The method of claim 1, the third polishing comprising a post-selective stop-on-silicon (Si) polishing.

7. The method of claim 6, the third polishing reducing the oxide layer to a top surface of the set of fins after the set of caps has been removed.

8. The method of claim 1, the semiconductor device comprising a FinFet device.

9. A method for polishing a semiconductor device, comprising:
    forming a set of fins in a substrate, the set of fins having a set of silicon nitride (SiN) caps;
    performing a first polishing of the semiconductor device to thin an oxide layer over the set of SiN fins;
    performing a second polishing of the semiconductor device to reduce the oxide layer selective to a top surface of the set of SiN caps on the set of fins; and
    performing a third polishing of the semiconductor device to further reduce the oxide layer and to remove the set of SiN caps from the set of fins.

10. The method of claim 9, the first polishing, the second polishing, and the third polishing being performing using at least one slurry having differing nitride, oxide, and silicon polishing rates.

11. The method of claim 9, the first polishing, the second polishing, and the third polishing each comprising chemical mechanic polishing.

12. The method of claim 9, the first polishing comprising a planarizing and thinning polishing.

13. The method of claim 9, the second polishing comprising a post-selective stop-on-nitride (Ni) polishing.

14. The method of claim 9, the third polishing comprising a post-selective stop-on-silicon (Si) polishing.

15. The method of claim 14, the third polishing reducing the oxide layer to a top surface of the set of fins after the set of caps has been removed.

16. The method of claim 9, the semiconductor device comprising a FinFET device.

17. A method for polishing a FinFET device, comprising:
    performing a planarizing polishing of the FinFET device using at least one slurry to thin an oxide layer over a set of fins of the FinFET device, the set of fins having a set of silicon nitride (SiN) caps on a top surface thereof, and the at least one slurry having differing nitride, oxide, and silicon polishing rates;
    performing a post-selective stop-on-nitride polishing of the FinFET device using the at least one slurry to reduce the oxide layer selective to a top surface of the set of SiN caps on the set of fins; and
    performing a post-selective stop-on-silicon polishing of the FinFET device using the at least one slurry to further reduce the oxide layer and to remove the set of SiN caps from the set of fins.

18. The method of claim 17, the post-selective stop-on-silicon polishing reducing the oxide layer to a top surface of the set of fins after the caps have been removed.

* * * * *